United States Patent [19]

Carney

[11] Patent Number: 4,466,696
[45] Date of Patent: Aug. 21, 1984

[54] SELF-ALIGNED COUPLING OF OPTICAL FIBER TO SEMICONDUCTOR LASER OR LED

[75] Inventor: James K. Carney, Eden Prairie, Minn.

[73] Assignee: Honeywell Inc., Minneapolis, Minn.

[21] Appl. No.: 362,703

[22] Filed: Mar. 29, 1982

[51] Int. Cl.³ .............................................. G02B 7/26
[52] U.S. Cl. ................................... 350/96.20; 372/7; 430/321
[58] Field of Search .................... 350/96.20, 96.18; 430/130, 313, 317, 321, 326; 372/7

[56] References Cited

U.S. PATENT DOCUMENTS

| | | | |
|---|---|---|---|
| 3,774,987 | 11/1973 | Boivin | 350/96 WG |
| 4,030,811 | 6/1977 | Khoe et al. | 350/96 C |
| 4,217,032 | 8/1980 | Sheem | 350/96.21 |
| 4,343,890 | 8/1982 | Phillips et al. | 430/321 |
| 4,399,542 | 8/1983 | Kawanishi | 372/47 |

OTHER PUBLICATIONS

IBM Technical Disclosure Bulletin, Optical Fiber--Waveguide Coupler, Lynch, 350 #96.18, vol. 21, No. 10, Mar. 1979.
Fabrication Processes for a Silicon Substrate Package for Integrated Gallium Arsenide Laser Arrays, Brady, Oct. 1978.
Blauveit et al., "AlGaAs Lasers with Micro-cleaved Mirrors Suitable for Monolithic Integration", *Appl. Phys. Lett.*, vol. 40, No. 4, Feb. 15, 1982, pp. 289-290.
Boivin, "Thin-Film Laser-to-Fiber Coupler", *Applied Optics*, Feb. 1974, vol. 13, No. 2, pp. 1391-1395.
Boyd & Sriram, "Optical Coupling from Fibers to Channel Waveguides Formed on Silicon", *Applied Optics*, Mar. 15, 1978, vol. 17, No. 6, pp. 895-898.
Hsu & Milton, "Flip-Chip Approach to Enforce Coupling between Single-Mode Optical Fibers & Channel Waveguides", *Electronic Letters*, Aug. 5, 1976, vol. 12, No. 16, pp. 404-405.

Primary Examiner—John D. Lee
Assistant Examiner—Akm E. Ullah
Attorney, Agent, or Firm—Omund R. Dahle

[57] ABSTRACT

The disclosure is directed to the self-aligned coupling of the core of an optical fiber to the narrow stripe emitting spot in the active layer of a narrow stripe semiconductor laser. In this invention a V-groove is etched into the same substrate onto which the epitaxial layers for the narrow stripe laser have been grown.

8 Claims, 3 Drawing Figures

SELF-ALIGNED COUPLING OF OPTICAL FIBER TO SEMICONDUCTOR LASER OR LED

BACKGROUND AND SUMMARY OF THE INVENTION

In the field of narrow stripe semiconductor lasers, the alignment of an optical fiber with the edge emitting region of a semiconductor laser is a difficult labor intensive process because of the small dimensions and extremely tight tolerances in fiber-to-laser position. The procedure described in this invention greatly simplifies the process of fiber alignment to an edge emitting narrow stripe laser.

In the alignment of an optical fiber to another optical element, there are five degrees of freedom (three position coordinates and 2 angles). In the prior art, fiber alignment aides were devised to reduce the number of degrees of freedom. One class of aides consists of etched V-shaped grooves in a single-crystal silicon substrate into which a fiber is placed. The optical element is aligned to the groove and thus, to the fiber.

In the prior art Boivin introduced the use of anisotropically etched grooves in silicon for fiber positioning. In his article "Thin-Film Laser-to-Fiber Coupler", Applied Optics, February 1974, Vol.13, No.2, P391–395, he described a laser-to-fiber coupler in which a thin film waveguide is used to focus an incoming laser beam (not restricted to semiconductor lasers) into the core of a fiber. The laser beam is first coupled into a thin-film waveguide by means of a grating coupler and the beam is focused by a thin film lens. The focused beam emerges from the waveguide to enter the core of the fiber. Accurate alignment of the fiber to the waveguide is achieved by supporting the fiber in a V-channel produced by crystallographic etching of the single-crystal silicon substrate on which the waveguide is fabricated.

The prior art also shows an incoming light carrying fiber being supported in a preferentially etched V-groove at the edge of a silicon substrate so that the fiber core feeds light directly into a thin-film channel waveguide deposited onto a SiO$_2$ layer at the surface of the silicon substrate (See Boyd & Sriram, "Optical Coupling From Fibers to Channel Waveguides Formed on Silicon", Applied Optics, Mar. 15, 1978, Vol.17, No.6, P895–8).

For the previous two examples, the optical element is fabricated on the same silicon substrate into which the V-grooves are etched. The critical alignment of the groove to the optical element is accomplished by photolithography, a technique capable of positional accuracy routinely better than 1 micron.

For a second type of alignment system, the silicon substrate and the optical element are separate pieces. Such is the case for elements which are not fabricated from silicon or thin films deposited on silicon (LiNbO$_3$ waveguides and semiconductor lasers).

In a flip-chip approach of the prior art, the optic fiber is positioned such that its core is just above the surface of a silicon wafer by placing the fibers in anisotropically etched V-grooves. This assembly is shown by Hsu and Milton in a report "Flip-Chip Approach to Endfire Coupling between Single-Mode Optical Fibers and Channel Waveguides", Electronic Letters, Aug. 5, 1976, Vol.12, No.16, P404–5. A LiNbO$_3$ channel waveguide is also mounted on the silicon wafer by flip-chip procedure. Before being glued down, the channel waveguide is aligned with the fiber by viewing through a microscope.

In the previous prior art example, there is a difficult, labor intensive alignment. The optical element and etched silicon substrate must be viewed under a microscope and physically positioning one with respect to the other using a micro-manipulator. In the flip-chip approach it is not possible to see the critical portion of the optical element during this alignment. The present invention is directed toward the elimination of this alignment in fiber to semiconductor laser coupling.

The present invention is directed to the self-aligned coupling of an optical fiber to a semiconductor narrow stripe laser or LED. The narrow stripe laser or LED may be any of the several narrow stripe types including the TJS (transverse junction stripe) type, the buried heterostructure stripe laser type, and the proton bombarded narrow stripe type. The semiconductor laser may have a GaAs substrate and may have thin-film epitaxial layers of Al$_{1-x}$Ga$_x$As and Al$_{1-y}$Ga$_y$As. One of the epitaxial layers is an active light emitting layer, the light being edge emitted through a processed laser mirror facet in the region defined by the laser stripe. The narrow stripe emitting spot in the active layer is generally less than 6 microns wide and the present invention is directed to the self-aligned coupling of that emitting spot to the optic fiber core which core is approximately 5–8 micron diameter.

DESCRIPTION

Figure 1:
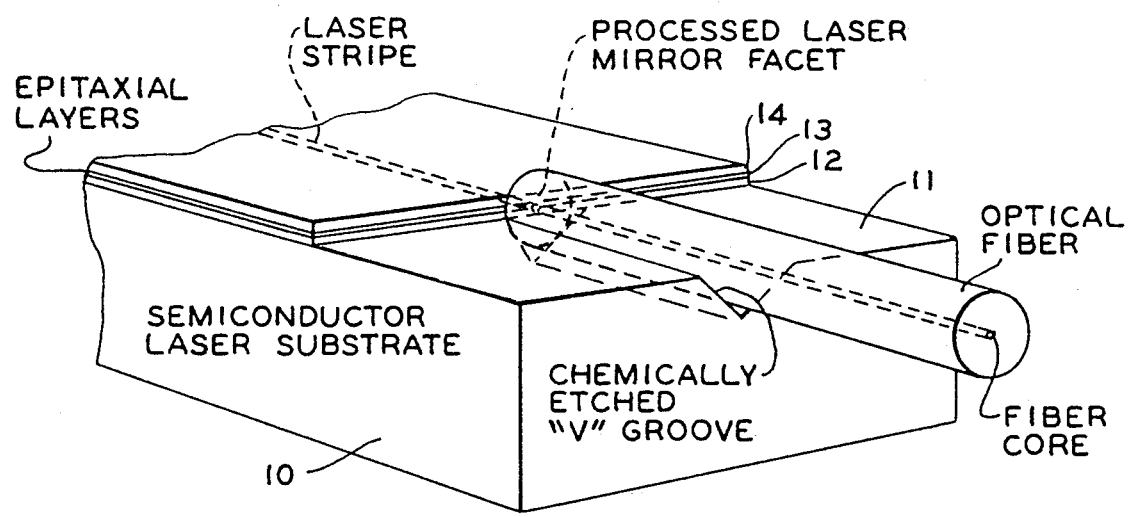
FIG. 1 is a pictorial presentation of the narrow stripe edge-emitting laser and self-aligned optical fiber.

Referring now to FIG. 1, there is shown pictorially the general configuration of an edge-emitting light source, that is, a narrow stripe laser or light emitting diode (LED) having a self-aligned coupling of optical fibers to the light source. The figure discloses a substrate 10 of semi-insulating GaAs having a top surface 11 upon which is epitaxially grown semiconductor layers 12, 13 and 14. These layers 12–15 which may be grown by employing MBE (molecular beam epitaxy), VPE (vapor phase epitaxy) or LPE (liquid phase epitaxy) preferably include an AlGaAs current confining layer 12, a GaAs active layer 13, an AlGaAs confining layer 14, and a GaAs capping layer 15 (not shown). These layers forming a multilayer epitaxial body may have a combined depth, by way of example, on the order of about 3–10 microns. If the narrow stripe laser is to be of the TJS (transverse junction stripe) type, layers 12–15 are grown n-doped, a mask of silicon nitride over the surface of layer 15 with a window over a portion thereof provides for a selective diffusion of p-type dopant such as Zn down through the epitaxial layers in order to make the required p+, p and n regions needed for the transverse junction stripe structure. This Zn diffusion extends down through the epitaxial layers 15, 14 and 13, and into or through layer 12 to provide a transverse p-n junction through the active GaAs layer 13. The remaining Si$_3$N$_4$ is removed and a p-metal contact 16 and an n-metal contact 17 are deposited over respective portions of the capping layer to thereby provide both electrical connections on the same surface.

A narrow groove etched down through the capping layer 15 at the transverse p-n junction directs the current flow path downward to the GaAs active layer 13 transverse junction. The active layer 13 is the active light emitting layer, the light being edge emitted through a processed laser mirror facet in the region defined by the laser stripe.

In this invention a V-groove is etched into the same semiconductor substrate 10 onto which the epitaxial layers for the laser have been grown. Because the V-groove is etched into the same material in which the laser or LED is fabricated, the critical alignment is done during a photolithographic process which has a resolution of one micrometer or less. There is never a problem of adjusting the position of the fiber with respect to the emitting region because the dimensions and position of the groove automatically position the fiber. In this invention the anisotropic etching capability of certain chemicals is employed. Proper crystal orientation of the substrate is important. The direction of light propagation in the laser or LED is chosen to be parallel to the line formed by the intersection of the wafer surface and the crystal slow etch planes. The entire wafer is covered by an etch mask. A stripe running in the direction of light propagation is opened in the etch mask. The stripe opening in the etch mask is positioned such that its center is directly in line with the stripe or emitting region of the laser or LED. If the laser is near the edge of the substrate, the stripe runs from the emitting region to the substrate edge. If the laser is in the center of the substrate, the stripe is long enough to accommodate the bending of the fiber.

Figure 2:
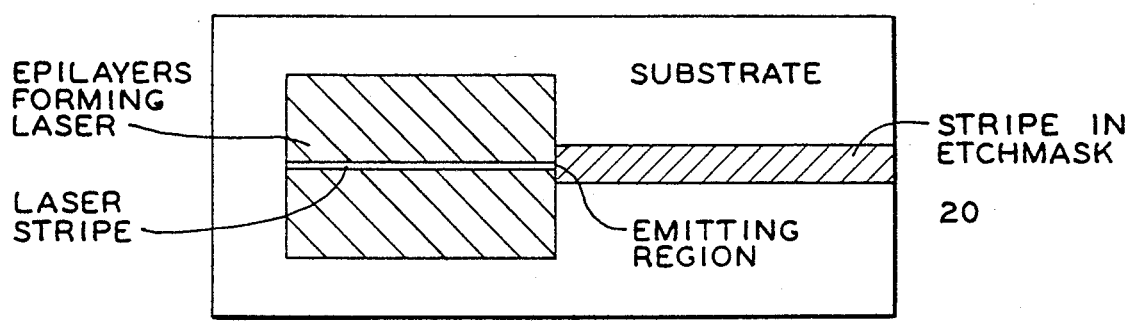
FIG. 2 is a top plan view of FIG. 1.
Figure 3:
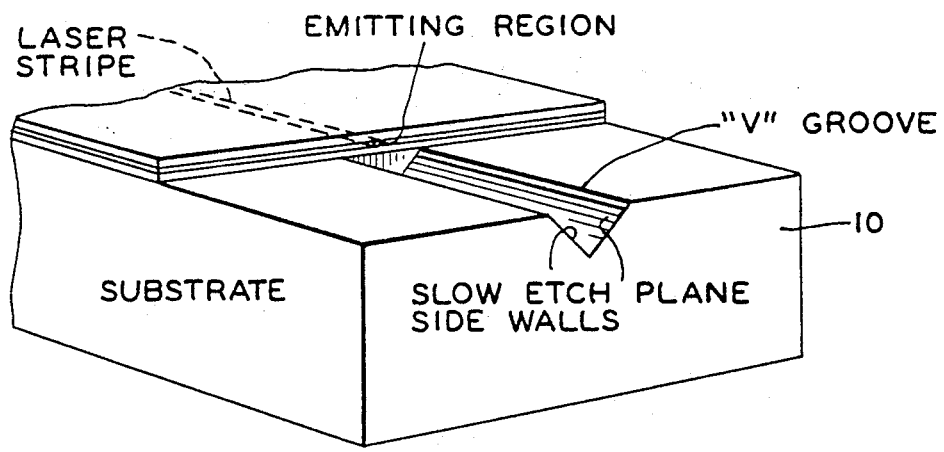
FIG. 3 is similar to FIG. 1 but without the fiber in place.

Referring now to FIG. 2, a top view is shown of the device described in FIG. 1. During anisotropic etching of this structure a V-groove forms in the substrate. The sides of the groove lie in the crystal slow-etch planes, which planes intersect at the bottom of the groove. The emitting (i.e. edge emitting) region of the laser or LED is equidistant from the two side walls of the V-groove as is shown more clearly in FIG. 3. The depth and width of the groove slowly increase at related rates with continued etching, but the time of etching is chosen so that when a fiber of known radius is placed in the groove and makes contact to the sidewalls formed by the slow-etch planes, the center of the fiber (fiber-core) is at the same height as the emitting region or spot of the laser or LED. The fiber is automatically aligned side-to-side by the groove walls.

The process employs the anisotropic etching capability of some chemicals. An example of an anisotropic etch for use in this invention is in a solution of sulfuric acid, hydrogen peroxide and water. In preparation, a laser or LED structure is fabricated in a semiconductor wafer with proper crystal orientation of the wafer. Thus in the case of GaAs the upper surface may be in the (100) plane and the anisotropic etch exposes the (111) planes, the slow-etch planes, as walls of the "V" groove. In the preparation of the narrow stripe laser the epitaxial layers are grown and the entire wafer is covered by an etch mask or photoresist. It may be desirable to first put alignment marks on the wafer for the succeeding laser fabrications and the V-groove fabrication steps. The laser stripe itself is then defined and fabricated by the conventional steps. This may take various sub-processes routes depending on the type of narrow stripe laser, that is, whether TJS, buried heterostructure, proton bombarded etc. The metal contacts are applied to the laser structure, both contacts on top in the case of the transverse junction stripe type, or one on the top and the other on the bottom in the case of other stripe lasers. Photoresist is again applied and a stripe 20, FIG. 2, is opened in the exposed substrate. The stripe opening in the photoresist is positioned such that its center line is directly in line with the emitting spot of the laser. During anisotropic etching of this structure a "V" groove forms in the substrate. The sides of the groove are the crystal slow-etch planes which intersect at the bottom of the groove. Thus in this process the "V" groove is etched into the same semiconductor substrate onto which the epitaxial layers for the laser have been grown.

The embodiments of the invention in which an exclusive property or right is claimed are defined as follows:

1. In a self-aligned coupling of an optical fiber to an integrated stripe laser including a semiconductor substrate with epitaxial layers deposited thereon in which one of the epitaxial layers is an active light emitting layer, the light being edge emitted through a processed laser mirror facet in the region defined by the laser stripe, the improvement comprising:
   an area of the semiconductor substrate extending beyond the processed laser mirror facet; and,
   an etched V-groove in the surface of said extended substrate and centered in line with the light emitting stripe, said V-groove being of a depth compatible with the diameter of optical fiber to be coupled so that when such fiber is positioned in said groove, the core of said fiber is at the same elevation as said light emitting region.

2. An edge-emitting stripe laser providing a self-aligned coupling of the laser to an optical fiber comprising:
   a semiconductor substrate having a planar surface;
   a plurality of epitaxial layers grown onto a portion of said planar surface to form a stripe laser therein, one of said layers being an active light emitting layer, the light being edge-emitted through a processed laser mirror facet in the region defined by the laser stripe;
   an area of the substrate planar surface extending beyond the processed laser mirror facet; and,
   an anisotropically etched V-groove in the surface of said extended substrate and centered in line with the light emitting stripe, said V-groove being of a depth compatible with the diameter of optical fiber to be coupled so that when such fiber is positioned in said groove, the core of said fiber is at the same elevation as said light emitting region.

3. The article according to claim 2 in which said substrate and said epitaxial layers are in the gallium arsenide family.

4. The article according to claim 2 in which said substrate is GaAs, said active light emitting epitaxial layer is $Al_xGa_{1-x}As$ and the epitaxial layer next to the active layer is $Al_{x'}Ga_{1-x'}As$ where $x' > x$.

5. The article according to claim 2 in which the thickness of said active light emitting layer is less than one micron and the width of the stripe emitting spot in said active layer is less than about 6 microns.

6. The article according to claim 2 in which the combined thickness of said epitaxial layers is on the order of 3-10 microns.

7. The article according to claim 2 in which the crystal orientation of the substrate is chosen so that the direction of light propagation in the laser is parallel to a line formed by the intersection of the wafer surface and the crystal slow-etch planes, whereby the sides of the anisotropically etched groove lies in the crystal slow-etch planes.

8. A method of providing a self-aligned coupling of an optical fiber to an integrated stripe laser comprising the steps of:

provlaser, formed edge emitting stripe laser formed in epitaxial layers on a planar surface of a semiconductor substrate having proper crystal orientation;

providing a processed laser mirror facet at the edge of said epitaxial layers in the region defined by the laser stripe, the facet being located at a distance from the edge of said planar surface so that an area of the semiconductor substrate extends beyond the processed laser mirror facet;

applying photoresist over the surface of said extended planar surface, exposing through a mask and developing to remove a strip of resist colinear with the laser stripe; and, etching with anisotropic etch a linear V-groove into the surface of the extended substrate where said strip of resist is removed, said etched V-groove being centered in line with the light emitting stripe, said etching continuing until said V-groove reaches a depth compatible with the diameter of an optical fiber to be coupled so that when such fiber is positioned in said groove, the core of said fiber is at the same elevation as said light emitting region.

* * * * *